United States Patent [19]

Kolakowski et al.

[11] 4,353,405
[45] Oct. 12, 1982

[54] CASTING METHOD

[75] Inventors: Thomas A. Kolakowski, Moreland Hills; Constantine Vishnevsky, Solon, both of Ohio

[73] Assignee: TRW Inc., Cleveland, Ohio

[21] Appl. No.: 141,312

[22] Filed: Apr. 18, 1980

[51] Int. Cl.³ .............................................. B22D 25/06
[52] U.S. Cl. .............................. 164/122.2; 164/122.1; 164/127
[58] Field of Search .............. 164/60, 127, 361, 122.2, 164/122.1; 249/174, 204

[56] References Cited

U.S. PATENT DOCUMENTS

| | | | |
|---|---|---|---|
| 2,791,813 | 5/1957 | Delano | 164/122.2 |
| 3,514,069 | 5/1970 | Daley | 249/174 X |
| 3,633,648 | 1/1972 | Barrow et al. | 164/60 |
| 3,759,310 | 9/1973 | Barrow et al. | 164/60 X |
| 3,915,761 | 10/1975 | Tschinkel et al. | 164/127 X |

*Primary Examiner*—Gus T. Hampilos
*Assistant Examiner*—K. Y. Lin
*Attorney, Agent, or Firm*—Yount & Tarolli

[57] ABSTRACT

An improved method of casting an article includes using the same starter element during the casting of a plurality of metal articles. In one specific instance the starter element consisted of a single metal crystal. The single crystal starter element was used to initiate the solidification of molten metal in a mold to form a single crystal cast article. This was done without significant bonding between the solidified metal and the single crystal starter element. Therefore, the starter element could be separated from the solidified body of metal and subsequently used in the casting of another article. In order to tend to maximize the rate of heat transfer from the starter element and to tend to minimize bonding of the molten metal with the starter element, the starter element is advantageously located in a recess in a chill block with an upper surface of the starter element even with an upper surface of the chill block. In order to retard formation of condensation and to prevent eroding of the metal of the starter element, one or more layers of metallic foil may be disposed between the starter element and the mold cavity.

15 Claims, 1 Drawing Figure

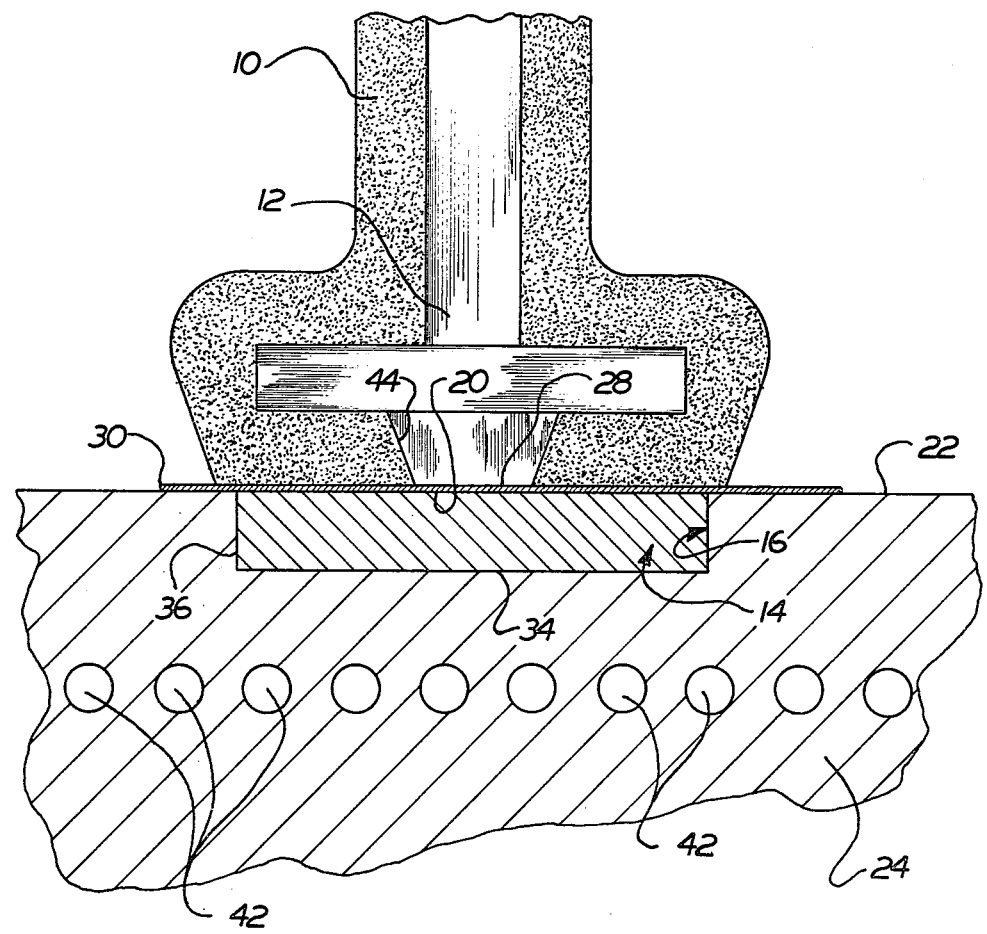

CASTING METHOD

BACKGROUND OF THE INVENTION

This invention relates generally to a method of casting an article and more specifically to a method of casting an article having desired crystallographic characteristics. A starter element having the same crystallographic characteristics as the article is used without significant bonding between the cast metal and the starter element.

The concept of casting single crystal articles is disclosed in U.S. Pat. Nos. 3,139,653; 3,759,310; 3,857,436; 4,015,657; 4,111,252; and 4,180,119. The use of a single crystal starter element having a predetermined orientation relative to a mold is disclosed in U.S. Pat. No. 3,139,653.

The use of a chill plate or block having a recess to receive a portion of a single crystal starter element or seed is disclosed in U.S. Pat. No. 3,759,310. The starter element extends only part way across the bottom of the mold cavity. The remainder of the bottom of the mold cavity is defined by a layer of ceramic material which is disposed over the chill plate. In following the teachings of this patent, an electric arc is established between a consumable electrode and the starter element to melt back the starter element. Since the use of an electric arc and melt back of the starter element are analogous to electric arc welding processes, it is believed that significant bonding occurs between the starter element and article being cast with welding of the starter element to the article.

SUMMARY OF THE PRESENT INVENTION

The present invention provides a new and improved method for casting articles. In practicing the method, a starter element having crystallographic characteristics corresponding to the desired crystallographic characteristics of a cast article is located at the bottom of a mold. At least a portion of the mold is preheated to a temperature above the solidus temperature of the starter element. The starter element is cooled to maintain it at a temperature below its solidus temperature. Molten metal is then poured into the mold.

Solidification of the molten melt is initiated at the starter element without significant bonding between the solidified body of metal and the starter element. The lack of significant bonding results from the formation of a physical discontinuity between the starter element and solidified body of metal. This enables the starter element to be separated from the solidified body of metal and subsequently reused to initiate the solidification of molten metal during the casting of another article.

Solidification of the molten metal at the starter element without bonding between the starter element and the molten metal may be promoted by positioning the starter element in a recess in a chill block. When this is done, the upper surface of the starter element is located at the same level as the surface of the chill block. By locating the starter element in a recess in the chill block, heat is transferred from all sides of the starter element to prevent significant bonding between the solidified article and the starter element.

In addition, the formation of impurities on the surface of the seed or starter element is minimized by positioning at least one layer of metallic foil over an upper surface of the chill block and starter element. The upper surface of the starter element should be prepared in such a manner as to minimize surface distortions which can result in recrystallization of the surface.

Accordingly, it is an object of this invention to provide a new and improved method of casting an article with desired crystallographic characteristics by using a starter element having the desired crystallographic characteristics to initiate solidification of the metal which is poured into a mold cavity without significant bonding between the metal and the starter element.

Another object of this invention is to provide a new and improved method of casting an article having desired crystallographic characteristics by positioning a starter element having the desired crystallographic characteristics in a recess in a chill block with an upper surface of the starter element at the same level as the upper surface of the chill block.

Another object of this invention is to provide a new and improved method of casting an article set forth in the preceding object and wherein foil is positioned on the upper surfaces of the chill block and starter element.

Another object of this invention is to provide a new and improved method of casting single crystal articles and wherein a physical discontinuity is formed between a single crystal starter element and a cast article during solidification of the article.

BRIEF DESCRIPTION OF THE DRAWINGS

The foregoing and other objects and features of the present invention will become more apparent upon a consideration of the accompanying drawing depicting the relationship between a mold, chill block or plate, starter element and a layer of foil.

DESCRIPTION OF A PREFERRED EMBODIMENT OF THE INVENTION

A mold 10 has a cavity 12 in which an article, such as a metal turbine blade, is to be cast. In the present instance, the turbine blade is to be formed as a single crystal casting. In order to form the article as a single crystal casting, a starter element 14 is formed as a single crystal. The single crystal starter element or seed 14 initiates solidification of molten metal in the cavity 12 to form a single crystal casting.

In accordance with one of the features of the present invention, the starter element 14 is disposed in a cavity 16 which is of the same size and configuration as the starter element 14. This results in the upper surface 20 of the starter element 14 being at the same level as or coplanar with an upper surface 22 of a chill block or plate 24 in which the recess 16 is formed. The upper surface 20 of the starter element 14 is larger than an open end 28 of the mold cavity 12 so that all of the molten metal in the lower end of the cavity 12 will be exposed to the upper surface 20 of the single crystal starter element 14.

One or more layers 30 of metallic foil are disposed between the upper surface 20 of the starter element 14 and the mold cavity 12. The foil 30 has essentially the same composition as the charge of molten metal which is poured into the mold cavity 12 or is of a composition compatible with the molten alloy. An individual foil layer has a thickness of approximately 0.0005 inches.

The foil 30 provides a heat transfer barrier so that the mold 10 can be heated to a higher temperature adjacent to the chill block 24. The foil 30 also acts as a seal to prevent exposure of the seed surface to gaseous contaminants in the mold cavity arising from ceramic decomposition. As a result of being able to heat the mold 10 to a relatively high temperature adjacent to the chill block 24, the lower end of the mold cavity 12 is relatively hot with a substantial reduction in the tendency for condensate to form at the lower end of the mold cavity. The mold is heated in a known manner with suitable induction coils and graphite susceptor (not shown). The chill plate 24 is cooled in a known manner by a flow of coolant through the passages 42. The chill plate 24 may be lowered to withdraw the mold from the induction coils to promote solidification of molten metal in the mold cavity 12 upwardly from the starter element 14 by using known apparatus.

In accordance with a feature of the present invention, there is no significant bonding between the metal which is solidified in the mold cavity 12 and the starter element 14. This enables the starter element 14 to be lightly cleaned and reused to initiate solidification of molten metal in another mold. Since the starter element 14 can be reused without preparing a seed surface by sawing, grinding or mechanical polishing, the formation of microscopic distortions and residual stresses in a surface layer of the starter element is prevented. This prevents recrystallization of the surface of the starter element during heating at the surface of the starter element.

In order to prevent the formation of a bond between the molten metal which is poured into the mold cavity 12 and the starter element 14, heat is transferred from the flat circular bottom surface 34 and from a cylindrical side or minor surface 36 of the starter element 14 to the chill block or plate 24. The cylindrical minor surface 36 interconnects the upper and lower circular major side surfaces 20 and 34 which are flat and extend parallel to each other.

The transfer of heat from the starter element to the chill block 24 is promoted by the fact that the starter element 14 is disposed entirely within the cylindrical recess 16. Therefore, there is abutting engagement between the chill block 24 and the vertically extending side 36 of the cylindrical starter element 14 throughout the length of the minor side 36. In addition, there is abutting engagement between the bottom surface 34 of the starter element and the chill block 24. This enables the starter element 14 to be maintained at a temperature below its solidus temperature while the upper portion of the mold 10 is preheated to a temperature substantially above the solidus temperature of the starter element.

It is not known precisely how the starter element 14 nucleates a single crystal casting without significant bonding between the upper surface 20 of the starter element and the molten metal. It is believed that the lack of bonding is due to the fact that as the molten metal in the mold 10 cools, the metal tends to contract sufficiently to prevent bonding between the metal and the starter element 14. Thus, even if the molten metal effects a slight surface melting of the relatively cool starter element 14, the molten metal undergoes contraction upon cooling. This contraction is believed to result in a strain sufficient to cause rupture of any minute connections which are formed along the upper surface 20 of the starter element 14. Therefore a physical discontinuity is formed between the starter element 14 and the body of metal in the mold cavity 12 as the metal solidifies. It is believed that if the metal of the starter element 14 was heated to a temperature above its solidus temperature during preheating, bonding or welding would be far more likely to occur between the cast metal and the starter element.

The formation of a bond between the molten metal and the upper surface 20 of the starter element 14 and the nucleation of spurious crystals are retarded by carefully preparing the starter element. Thus, the starter element may be cut from a long single crystal blank by using abrasive water-cooled wheels or diamond impregnated metal saws. The cut surface of the starter element 14, that is the surface 20, should then be wet sanded with abrasive papers of increasing fineness. The finest paper used is typically 600 grit. Final preparation of the upper surface 20 of the starter element 14 involves acid etching to remove any remnants of cold working. Other nonmechanical means of metal removal such as electrolytic polishing could also be used. However, care should be taken to avoid straining the surface of the starter element 14.

When an article is to be cast, the properly prepared single crystal starter element 14 is positioned in the recess 16 of the chill block 24. At this time, the flat upper surface 20 of the starter element 14 is coplanar with the flat upper surface 22 of the chill block 24. At least one layer of foil 30 is then positioned over the upper surface 20 of the starter element 14 and a portion of the upper surface 22 of the chill block 24. The mold 10 is then positioned directly over the starter element 14 on the foil 30. It should be noted that the starter element 14 extends completely across an opening 44 formed in the mold 10.

The mold 10 is then preheated. The layer or layers of foil 30 function as a heat transfer barrier and seal. The starter element 14 is cooled by a transfer of heat from the starter element to the chill plate or block 24 which is in turn cooled by a flow of coolant through the passages 42.

During preheating of the mold 10, the starter element or seed crystal 14 is heated to a temperature which is below the melting point or liquidus temperature of the alloy forming the starter element. A peak starter element temperature not in excess of the solidus temperature, that is the temperature at which melting of the alloy first occurs, is considered sufficient. However to prevent nucleation on the sides of the mold cavity 12, the mold 10 is preheated. The mold is preheated to a temperature sufficient to prevent nucleation of spurious grains after superheated metal is poured. To this end, at least the upper portion of the mold is preheated to a temperature above the solidus temperature of the metal to be poured.

A properly prepared upper surface of the starter element 14 can nucleate a single crystal at substantially lower temperatures than the solidus temperature of the alloy forming the starter crystal. This leads to a virtual absence of bonding or welding of the upper surface 20 of the starter element 14 to the molten metal in the mold 10.

After preheating the mold 10, molten metal is poured into the cavity 12. The foil 30 has a composition which is essentially the same or otherwise compatible with the molten metal which is poured into the cavity. With nickel base superalloys, nickel foil is particularly suitable. The layer or layers 30 of metal foil keep the surface 20 free of condensate and/or impurities which may be present in the furnace environment. In addition the foil tends to prevent the molten metal from eroding the starter element 14 as the molten metal is poured into the cavity 12.

Since the starter element 14 is relatively cold, the molten metal is ineffective to melt the starter element 14 to any significant extent. Thus it is believed that at most the molten metal causes an incipient melting of an extremely thin uppermost portion of the starter element 14 so that the molten metal begins to solidify against the upper surface of the starter element with the same crystallographic characteristics as the starter element 14. Since the starter element 14 is not fully melted at this time, there is no significant bonding between the molten metal in the mold cavity 12 and the starter element 14. Therefore, a clear plane of demarcation is formed between the upper surface 20 of the starter element 14 and the metal in the mold cavity 12 as the metal solidifies.

The formation of a bond between the molten metal in the mold cavity 12 and the starter element 14 is retarded by the presence of the metallic foil 30 and the fact that the starter element is cooled by the chill block 14. It is believed that any tendency for a bond to form between the molten metal and the starter element 14 is offset by a tendency for the molten metal to contract and draw away from the starter element 14 as the metal is cooled.

Once the solidification of the molten metal has been initiated to form a single crystal article in the mold cavity 12, the mold 10 is withdrawn downwardly from the induction coils to provide for a gradual upwardly (as viewed in the drawing) solidification of the metal in the mold cavity 12. As this occurs, a single crystal article is formed in the mold cavity 12. After an article has been cast in the mold cavity 12, the starter element 14 is reused in association with another mold to cast another single crystal article.

In the embodiment of the invention shown in the drawing, the starter element 14 is recessed in the chill plate 24. It is believed that this arrangement may be preferred since only the upper surface 20 of the starter element 14 is exposed to the molten metal. This keeps the molten metal from flowing around the sides 36 of the starter element 14 to prevent the formation of flash. However, it is contemplated that at least some of the advantages of the present invention may be obtained without recessing the starter element 14 in the chill block 24.

In one experiment, a mold having sixteen casting cavities was provided with sixteen starter elements 14 having heights which ranged from one to two inches. The starter elements were positioned directly on the chill plate 24 and were not recessed into the chill plate. A proprietary alloy known in the industry as PWA 1480 was poured at a temperature of approximately 2850° F. into the mold cavities. This same alloy was also used in the starter elements. After pouring the alloy, the mold was gradually withdrawn from the hot zone of the furnace.

Many of the starter elements were effective to initiate the formation of single crystal articles without significant bonding between the starter elements and the molten metal. Thus, there were continuous physical discontinuities between the cast metal articles and many of the starter elements. This enables the starter elements to be subsequently reused with a minimum of difficulty.

Two of the sixteen castings which were formed during the experiment were misplaced. Of the remaining fourteen castings only nine were sectioned to determine whether or not significant bonding occurred between the cast metal article and the starter element. Of the nine castings which were sectioned, there was no significant bonding between six of the starter elements and the six associated metal articles. The reason for the occurence of at least some bonding between the remaining three cast articles and the starter elements is not known.

It is believed that during this experiment the upper surfaces of the starter elements 14 were at a temperature below their solidus temperatures. However the mold was preheated, at a location above the upper surface of the starter elements, to a temperature of about 2700° F. which is well above the solidus temperature of the starter element and cast alloy. After the alloy had been poured, the mold was gradually withdrawn from the hot zone in the furnace to allow crystal growth to occur.

Although it is believed that the present invention will be particularly advantageous when single crystal articles are to be formed in the mold cavity 12, it is contemplated that DS (directionally solidified) articles could be formed by using a multigrain DS starter element if desired. If such a starter element was used, the crystallographic characteristics of the article cast in the mold would be the same as the crystallographic characteristics of the starter element, that is the cast article would be a directionally solidified multigrained article.

In view of the foregoing it is apparent that the present invention relates to a method in which a starter element 14 having a crystallographic characteristic corresponding to the desired crystallographic characteristic of a cast article is located at the bottom of a mold 10. The starter element 14 is cooled and molten metal is poured into the mold. Solidification of the molten metal is initiated at the starter element 14 without significant bonding between the solidified body of metal and the starter element. Thus, a physical discontinuity is formed between the starter element and the metal in the mold cavity 12 as the metal solidifies. This enables the starter element to be separated from the solidified body of metal and subsequently reused to initiate the solidification of molten metal during the casting of another article.

Initiation of solidification of the molten metal in the mold is promoted by positioning the starter element 14 in a recess 16 in a chill block 24. The upper surface 20 of the starter element 14 is located at the same level as the upper surface 22 of the chill block 24. By locating the starter element 14 in a recess 16 in the chill block 24, heat is transferred from all sides of the starter element to prevent significant bonding between the solidified article and the starter element.

Having described a specific preferred embodiment of the invention, the following is claimed:

1. A method of casting articles having desired crystallographic characteristics, said method comprising the steps of providing a starter element having crystallographic characteristics corresponding to the desired crystallographic characteristics of the cast articles, positioning the starter element and a mold relative to each other with the starter element in a predetermined position in a mold cavity, cooling the starter element, flowing a body of molten metal into the mold cavity, maintaining the starter element at a temperature below its solidus temperature throughout the extent of the starter element until engagement of the molten metal with the starter element, solidifying the body of molten metal in the mold cavity, said step of solidifying the body of molten metal including the step of initiating solidification of the molten metal at the starter element while performing said step of flowing molten metal into the mold cavity, providing a physical discontinuity between the cast article and the starter element during solidification of the molten metal such that to form a cast article having crystallographic characteristics determined by the crystallographic characteristics of the starter element without significant bonding between the solidified body of metal and the starter element, separating the solidified body of metal from the starter element at the physical discontinuity, and subsequently using the starter element to initiate the solidification of a second body of molten metal during the casting of another article.

2. A method of casting single crystal articles, said method comprising the steps of providing a single crystal starter element, positioning the single crystal starter element and a mold relative to each other, preheating at least a portion of the mold, maintaining the single crystal starter element at a temperature below its solidus temperature during preheating of the mold, flowing a body of molten metal into a mold cavity after preheating the mold, maintaining the single crystal starter element at a temperature below its solidus temperature throughout the extent of the starter element until engagement of the molten metal with the starter element, solidifying the body of molten metal in the mold cavity to form a single crystal cast article, said step of solidifying the body of molten metal including the step of initiating solidification of the molten metal at the single crystal starter element while performing said step of flowing molten metal into the mold cavity, providing a physical discontinuity between the single crystal cast article and the single crystal starter element during solidification of the molten metal, and separating the single crystal cast article from the single crystal starter element at the physical discontinuity and subsequently using the stater element to initiate the solidification of a second body of molten metal during the casting of another article.

3. A method of casting single crystal articles, said method comprising the steps of providing a single crystal starter element, positioning the single crystal starter element and a mold relative to each other with the starter element in a predetermined position in a mold cavity, preheating the mold while cooling the single crystal starter element, flowing a body of molten metal into the mold cavity after preheating the mold and while continuing to cool the single crystal starter element, maintaining the single crystal starter element at a temperature below its solidus temperature throughout the extent of the starter element until engagement of the molten metal with the starter element, solidifying the body of molten metal in the mold cavity, said step of solidifying the body of molten metal including the step of initiating solidification of the molten metal at the single crystal starter element while performing said step of flowing molten metal into the mold cavity, providing a physical discontinuity between the single crystal casting article and the single crystal starter element during solidification of the molten metal such that to form a cast single crystal article without significant bonding between the solidified body of metal and the single crystal starter element, separating the solidified body of metal from the single crystal starter element at the physical discontinuity, and subsequently using the single crystal starter element to initiate the solidification of a second body of molten metal during the casting of another single crystal article.

4. A method as set forth in claim 3 further including the step of positioning a layer of foil in flat abutting engagement with an upper surface of the single crystal starter element prior to performing said step of flowing a body of molten metal into the mold cavity, said step of flowing a molten body of metal into the mold cavity including the step of at least partially melting the layer of foil with the molten body of metal prior to initiation of said step of solidifying the body of molten metal.

5. A method as set forth in claim 1 further including the steps of providing a chill block having a recess with a configuration corresponding to the configuration of the starter element, said step of positioning the starter element and mold relative to each other including the step of positioning the starter element in the recess in the chill block with an upper surface of the starter element at the same level as an upper surface of the chill block, said step of cooling the starter element including the step of transferring heat from the starter element to the chill block while the starter element is disposed in the recess in the chill block.

6. A method of casting as set forth in claim 5 further including the step of positioning a layer of foil over the upper surface of the chill block and the upper surface of the starter element prior to performing said step of flowing a body of molten metal into the mold cavity.

7. A method as set forth in claim 1 further including the steps of preheating at least a portion of the mold and maintaining the starter element at a temperature below its solidus temperature during preheating of the mold.

8. A method as set forth in claim 2 wherein said step of maintaining the single crystal starter element at a temperature below its solidus temperature during preheating of the mold includes the step of cooling the single crystal starter element.

9. A method as set forth in claim 2 wherein said step of forming a physical discontinuity between the single crystal cast article and the single crystal starter element includes the step of contracting the body of molten metal as it solidifies.

10. A method as set forth in claim 2 further including the steps of providing a chill block having a recess with a configuration corresponding to the configuration of the single crystal starter element, said step of positioning the single crystal starter element and mold relative to each other including the step of positioning the starter element in the recess in the chill block with an upper surface of the starter element at the same level as an upper surface of the chill block, said step of maintaining the single crystal starter element at a temperature below its solidus temperature including the step of transferring heat from the starter element to the chill block while the starter element is disposed in the recess in the chill block.

11. A method of casting as set forth in claim 10 further including the step of positioning a layer of foil over and in engagement with the upper surface of the chill block and the upper surface of the single crystal starter element prior to performing said step of preheating the mold.

12. A method as set forth in claim 2 further including the steps of positioning a layer of foil over an upper surface of the single crystal starter element prior to performing said step of preheating the mold.

13. A method as set forth in claim 3 further including the steps of providing a chill block having a recess with a configuration corresponding to the configuration of the single crystal starter element, said step of positioning the starter element and mold relative to each other including the step of positioning the starter element in the recess in the chill block, said step of cooling the single crystal starter element including the step of transferring heat from the single crystal starter element to the chill block while the single crystal starter element is disposed in the recess in the chill block.

14. A method of casting as set forth in claim 13 further including the step of positioning a layer of foil over and in engagement with an upper surface of the single crystal starter element prior to performing said step of flowing a body of molten metal into the mold cavity.

15. A method as set forth in claim 3 further including the step of maintaining the single crystal starter element at a temperature below its solidus temperature during preheating of the mold.

* * * * *